United States Patent
Huijsing et al.

(10) Patent No.: US 8,120,422 B1
(45) Date of Patent: Feb. 21, 2012

(54) RIPPLE REDUCTION LOOP FOR CHOPPER AMPLIFIERS AND CHOPPER-STABILIZED AMPLIFIERS

(75) Inventors: Johan Hendrik Huijsing, Schipluiden (NL); Kofi A. A. Makinwa, Delft (NL); Rong Wu, Delft (NL)

(73) Assignee: Maxim Integrated Products, Inc., Sunnyvale, CA (US)

( * ) Notice: Subject to any disclaimer, the term of this patent is extended or adjusted under 35 U.S.C. 154(b) by 343 days.

(21) Appl. No.: 12/475,219

(22) Filed: May 29, 2009

Related U.S. Application Data

(60) Provisional application No. 61/149,532, filed on Feb. 3, 2009.

(51) Int. Cl.
*H03F 3/68* (2006.01)
(52) U.S. Cl. .............................. 330/9; 330/107; 327/124
(58) Field of Classification Search .............. 330/9, 107; 327/124
See application file for complete search history.

(56) References Cited

U.S. PATENT DOCUMENTS

| 7,209,000 B2 | 4/2007 | Huijsing et al. | |
|---|---|---|---|
| 2009/0278597 A1* | 11/2009 | Zhang et al. | 330/9 |
| 2010/0188141 A1* | 7/2010 | Aruga et al. | 327/539 |

OTHER PUBLICATIONS

Burt, Rod , et al., "A Micropower Chopper-Stabilized Operational Amplifier using a SC Notch Filter with Synchronous Integration inside the Continuous-Time Signal Path" *2006 IEEE International Solid-State Circuits Conference*, Session 19, Analog Techniques, 19.6.

Denison, Timothy, et al., "A 2.2 µW 94n V/√Hz, Chopper-Stabilized Instrumentation Amplifier for EEG Detection in Chronic Implants", *2007 IEEE International Solid-State Circuits Conference*, Session 8, Biomedical Devices, 8.6.

Harrison, Reid R., et al., "A Low-Power Low-Noise CMOS Amplifier for Neural Recording Applications", *IEEE Journal of Solid-State Circuits*, vol. 38, No. 6, (Jun. 2003), pp. 958-965.

Huijsing, Johan H., "Instrumentation Amplifier Developments", *AACD*, Milan, (2008).

Huijsing, Johan H., "Operational Amplifiers, Theory and Design", Kluwer Academic Publishers, (2001), pp. 52-53.

Kashmiri, S. M., et al., "A Temperature-to-Digital Converter Based on an Optimized Electrothermal Filter", *ESSCIRC Dig. Tech. Papers*, (Sep. 2008), pp. 74-77.

(Continued)

*Primary Examiner* — Michael Shingleton
(74) *Attorney, Agent, or Firm* — Blakely Sokoloff Taylor & Zafman LLP

(57) ABSTRACT

Ripple reduction loop for chopper amplifiers and chopper-stabilized amplifiers. The ripple reduction loop includes a first chopper, a first amplifier having an input coupled to an output of the first chopper, a second chopper having an input coupled to an output of the first amplifier, a second amplifier having an input coupled to an output of the second chopper, a third chopper, an output of the second amplifier having its output capacitively coupled to an input of the third chopper as the only input to the third chopper, a third amplifier coupled as an integrator having an input coupled to an output of the third chopper, an output of the integrator being coupled to combine with the output of the first amplifier as the input of the second chopper, and at least one Miller capacitor coupled between an output of the second amplifier and the input of the second amplifier. Various embodiments are disclosed.

21 Claims, 12 Drawing Sheets

OTHER PUBLICATIONS

Tang, T. K., "A 3μV-Offset Operational Amplifier with 20nV/√Hz Input Noise PSD at DC Employing both Chopping and Autozeroing" *2002 IEEE International Solid-State Circuits Conference*, Session 23, Analog Techniques, 23.4.

Witte, J. F., et al., "A Current-Feedback Instrumentation Amplifier with 5μV Offset for Bidirectional High-Side Current-Sensing", *2008 IEEE International Solid-State Circuits Conference*, Session 3, Filters and Amplifiers, 3.5.

Yazicioglu, Refet F., et al., "A 200μW Eight-Channel Acquisition ASIC for Ambulatory EEG Systems", *2008 IEEE International Solid-State Circuits Conference*, Session 8, Medical & Displays, 8.2.

* cited by examiner

RIPPLE REDUCTION LOOP FOR CHOPPER AMPLIFIERS AND CHOPPER-STABILIZED AMPLIFIERS

CROSS-REFERENCE TO RELATED APPLICATION

This application claims the benefit of U.S. Provisional Patent Application No. 61/149,532 filed Feb. 3, 2009.

BACKGROUND OF THE INVENTION

1. Field of the Invention

The present invention relates to the field of operational and instrumentation amplifiers.

2. Prior Art

U.S. Pat. No. 7,209,000 entitled "Frequency Stabilization of Chopper-Stabilized Amplifiers" discloses frequency stabilization of chopper-stabilized amplifiers using multipath hybrid single or double nested Miller compensation, the disclosure of which is hereby incorporated by reference. The compensation may provide a desired 6 dB/oct roll off for both instrumentation amplifiers and operational amplifiers.

Another important reference is a paper presented at the AACD in Milan on April 8-10 by Johan H. Huijsing of Delft University of Technology, and published in Analog Circuit Design, edited by Michiel Steyaert, Arthur van Roermund, and Herman Casier, Springer Science + Business Media B.V. 2009, pp. 99-123, referred to herein as the Springer paper, and also hereby incorporated herein by reference. It does not include the Ripple Reduction Loop of the present invention. The new drawings presented herein are derived from that paper, but do include the Ripple Reduction Loop of the present invention.

DETAILED DESCRIPTION OF THE PREFERRED EMBODIMENTS

The two references cited in the prior art section are of background interest, but do not include the Ripple Reduction Loop of the present invention. The drawings presented herein for the present invention are derived from the Springer paper. As used herein and in the claims to follow, the word amplifier means an amplifier comprising one or more stages. Also while the various embodiments are disclosed herein with respect to exemplary embodiments using transconductance amplifiers, and where more specific, are shown as using CMOS devices, the present invention is not so limited, and may be realized, by way of example, using voltage amplifiers and/or bipolar transistors.

Figure 1:
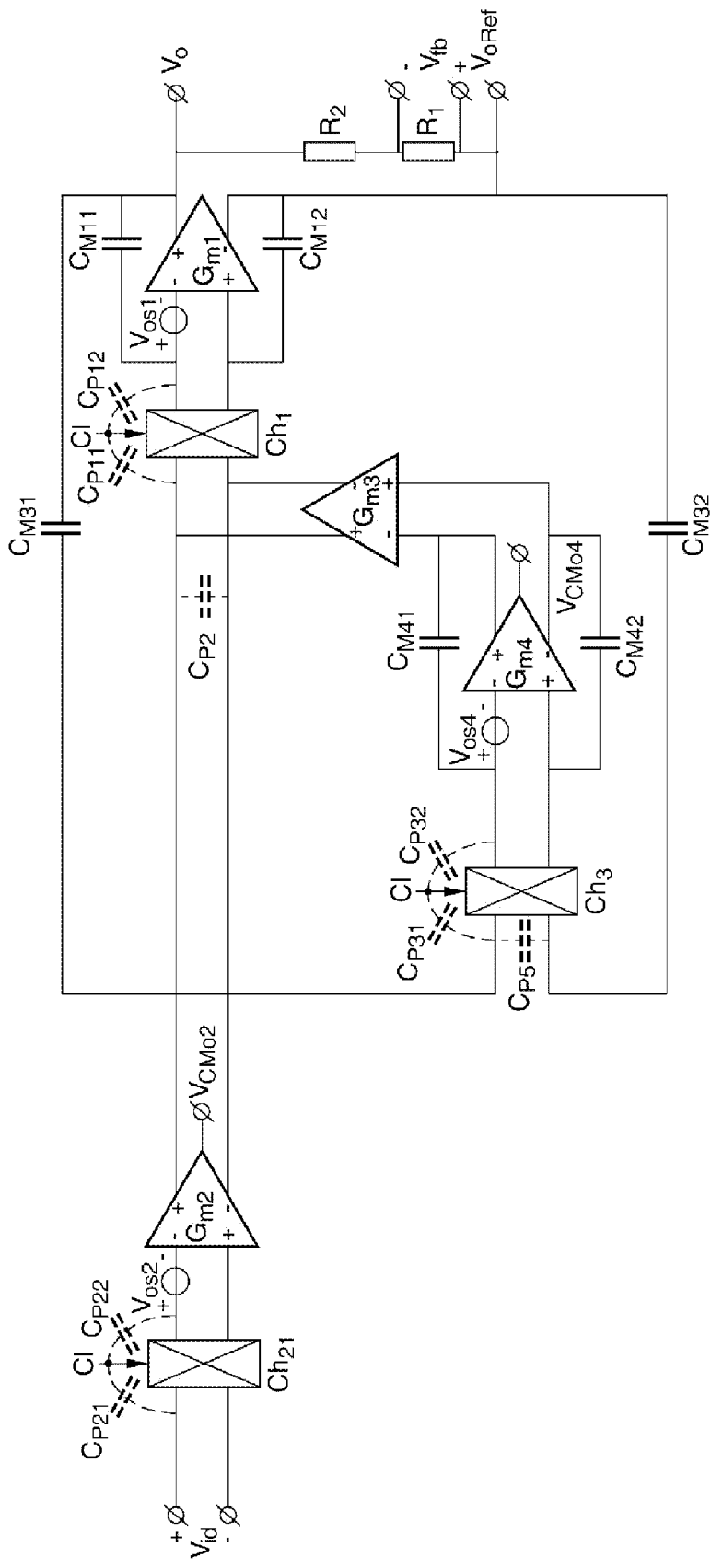
FIG. 1 is a diagram illustrating one embodiment of an operational amplifier in accordance with the present invention.
Figure 8:
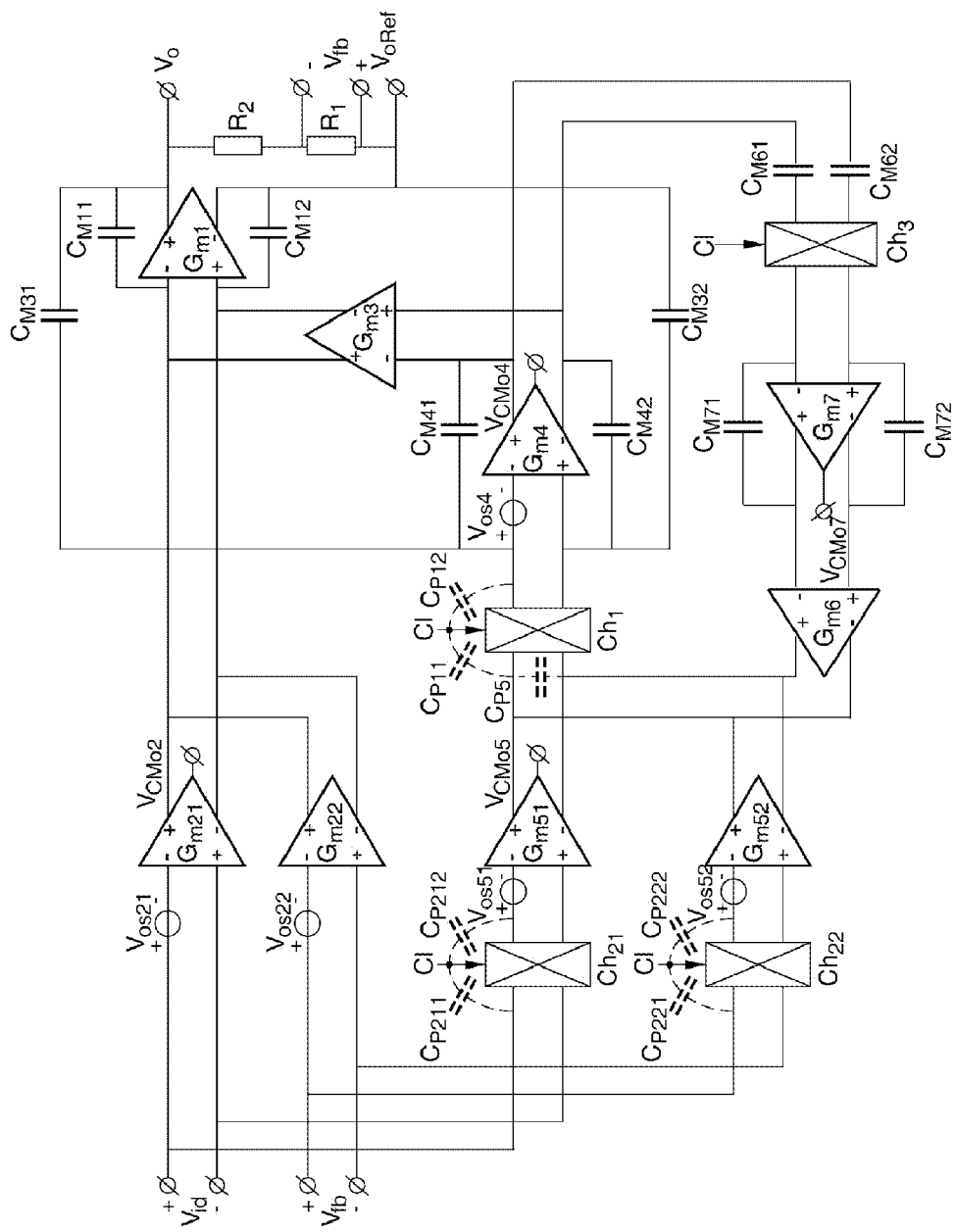
FIG. 8 is a diagram illustrating still another embodiment of an instrumentation amplifier in accordance with the present invention.

The operational amplifier of FIG. 1 may be compared to FIG. 8.1 of the Springer paper. FIG. 1 herein clearly shows that amplifier G5, or G7 in FIG. 16 or FIG. 8 of the U.S. Pat. No. 7,209,000, are no longer needed. In FIG. 1 herein, there is only one feed-forward path through Gm2. Therefore, Miller capacitors CM11 and CM12 are sufficient to obtain a straight 6 dB per octave roll-off. CM31 and CM32 of FIG. 8.1 of Springer (or Cm51 and Cm52 in FIG. 16 or FIG. 8 of the '000 patent) need not anymore obey the rule CM3=CM1 (Gm5/Gm2) which the '000 patent describes. Hence CM31 and CM32 can be freely chosen to optimize the ripple reduction of the present invention.

The ripple reduction loop functions quite simply. If Gm2 between the choppers has an offset Vos and there is no input voltage, than the output of Gm2 has a DC output offset current (equal to Vos×Gm2). Chopper2 converts this DC current into a square-wave current at its output. The output Miller integrator stage Gm1 changes the square wave input current into a triangle output voltage, referred to herein as "the output ripple". The ripple reduction capacitors Cm31 and Cm32 sense this triangular voltage and transform it into a square wave current. That square wave current is rectified by the chopper Ch3 and integrated by integrator Gm4. The output voltage of Gm4 is used by control amplifier Gm3 to correct the offset of Gm2 if the sign in the ripple reduction loop is correct. The integrator G4 goes on integrating as long as there is a ripple. When the ripple is reduced to virtually zero, the output current of control amplifier Gm3 precisely corrects the offset of Gm2. The result is a simple chopper amplifier without offset and without ripple. (Amplifier Gm1 has an input offset, but that offset, when referred back to the input $v_{id}$ to the amplifier system, is reduced by the gain of amplifier Gm2).

Figure 2A:
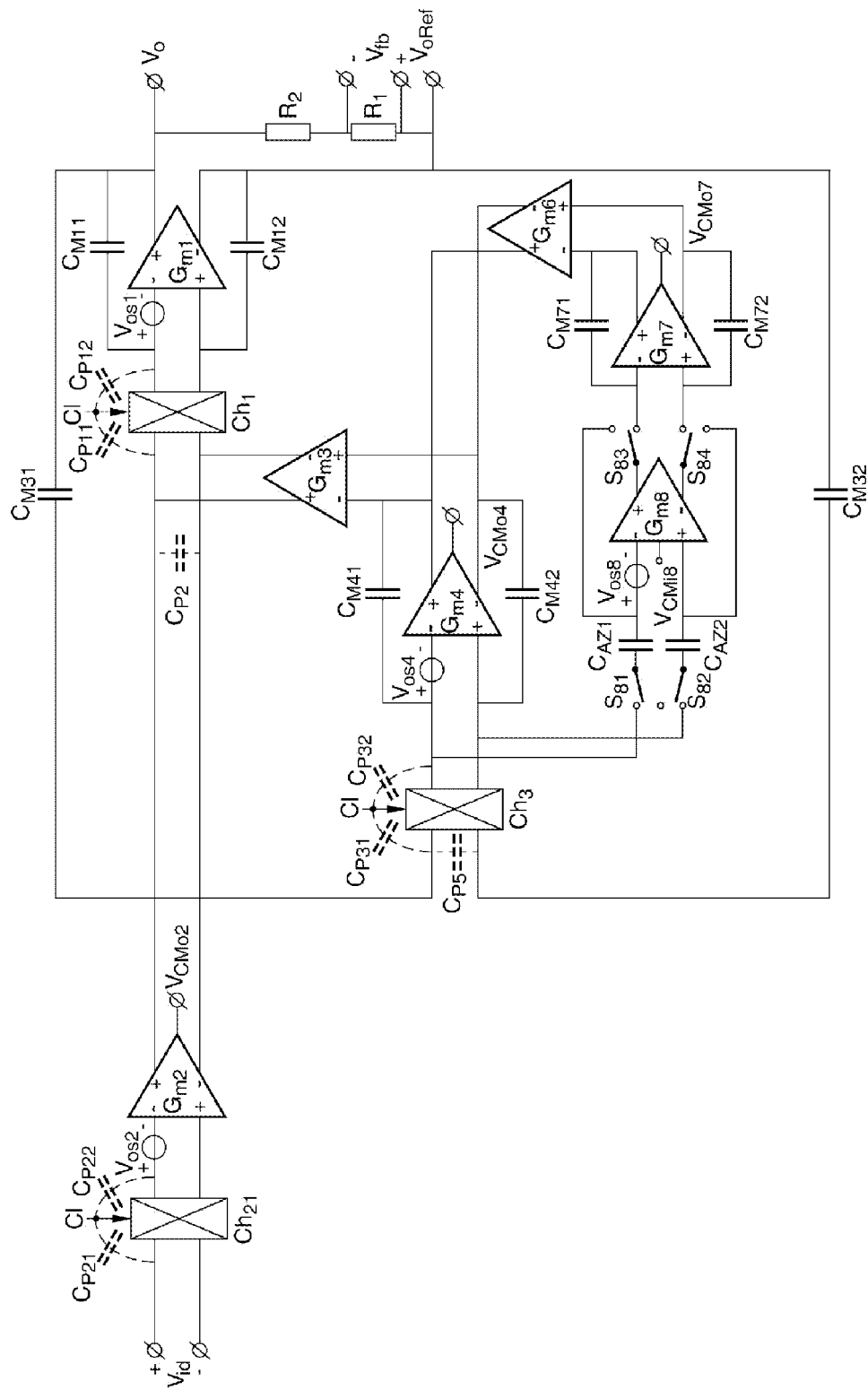
FIG. 2a is a diagram illustrating another embodiment of an operational amplifier in accordance with the present invention, this embodiment having an offset compensation loop.

The operational amplifier of FIG. 2a shows how one can reduce the offset of Gm4 for example by inserting an offset reduction loop with an auto-zeroed Gm8, integrator Gm7 and control amplifier Gm6. This was also needed in FIG. 8.2 of the Springer paper to further reduce ripple. The offset reduction of Gm4 can be implemented in many ways.

Figure 2B:
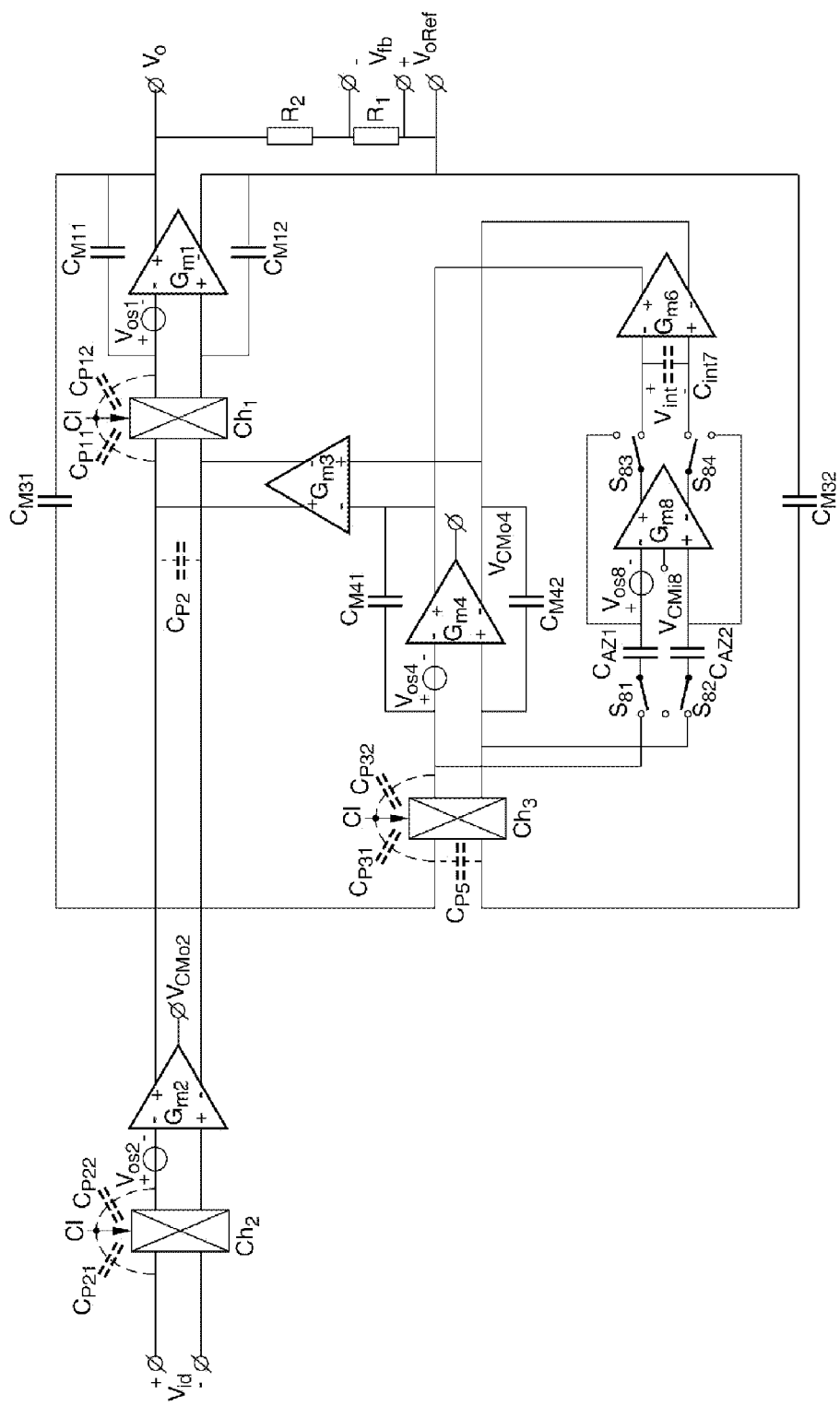
FIG. 2b is a diagram illustrating another embodiment of an operational amplifier in accordance with the present invention, this embodiment having an alternate offset compensation loop.

In the circuit of the FIG. 2a, the offset reduction of Gm4 is needed to take away the ripple floor that is otherwise introduced by the offset of Gm4. This can be explained as follows: If Gm4 has offset, the feedback around Gm4 makes this appear as a hard offset voltage Vos4 in front of Gm4. This offset appears as a square wave with a peak-to-peak value of 2Vos4 in front of the chopper Ch3. The capacitors CM31 and Cm31 are charged back and forth with this voltage. This charge is rectified by Ch3, integrated by Gm4, amplified by Gm3, and appears as an offset of Gm2, or as a ripple at the output. The peak-to-peak output ripple can therefore never be lower as 2Vos4, as that ripple voltage is needed to compensate the ripple at the left hand side of Ch3. While FIG. 2a shows an auto-zeroed Gm8 in the offset compensation loop, any of many other offset compensation loops may be used. As an example, FIG. 2b shows a chopper operational amplifier with a ripple-reduction loop. The ripple-reduction loop has an offset-compensation loop around integrator Gm4. The offset-compensation loop consists of an auto-zero amplifier Gm8, a passive integrator Cint7, and a control amplifier Gm6. If amplifier Gm4 has offset, then this is sensed by the auto-zero amplifier Gm8. The output current of Gm8 is integrated by a passive integrator Cint7. The voltage Vint on Cint7 is used by control amplifier Gm6 to cancel the offset of the integrator Gm4, as in FIG. 2a.

Figure 2C:
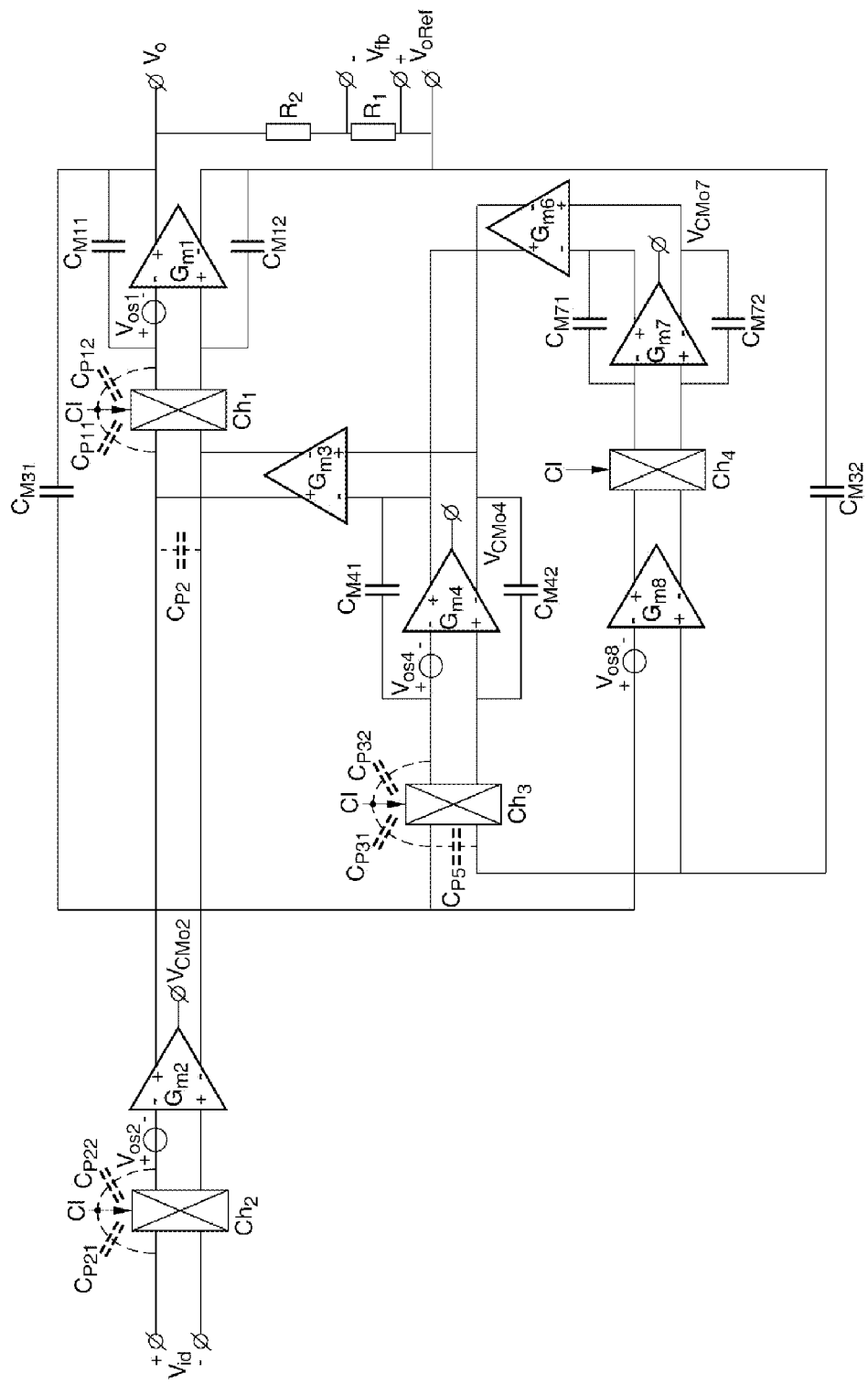
FIG. 2c is a diagram illustrating a further embodiment of an operational amplifier in accordance with the present invention, this embodiment having a further alternate offset compensation loop.

A further alternate embodiment of offset compensation is shown in FIG. 2c. The offset-compensation loop, referred to herein and in the claims as a chopper loop, consists of the chopper Ch3, a sense amplifier Gm8, a chopper Ch4, an active integrator Gm7, and a control amplifier Gm6. If the integrator Gm4 has offset, there will be a square wave in front of chopper Ch3. This square wave is sensed by Gm8. The square wave output current of Gm8 is being rectified by Ch4 and integrated by Gm7. The output of the integrator is coupled to the output of the integrator Gm4 in order to correct its offset. If sense amplifier Gm8 has offset, its output current is modulated by Ch4 and integrated by Gm7. Therefore a small triangle ripple will be present on the output voltage of Gm7. This ripple is further reduced by the control amplifier Gm6 that is relative weak in regard to Gm4. Therefore the resulting ripple on the output of integrator Gm4 will be even smaller. The same reduction of signal takes place again when this ripple is further coupled towards the output by control amplifier Gm3 which is weaker than Gm2. Hence, the ripple due to the offset Vos8 of Gm8 can be neglected.

What holds for the operational amplifiers of FIG. 1 and FIGS. 2a, 2b and 2c above, also is valid for Current-Feedback Instrumentation Amplifiers. These amplifiers are explained in the Springer paper.

Figure 3:
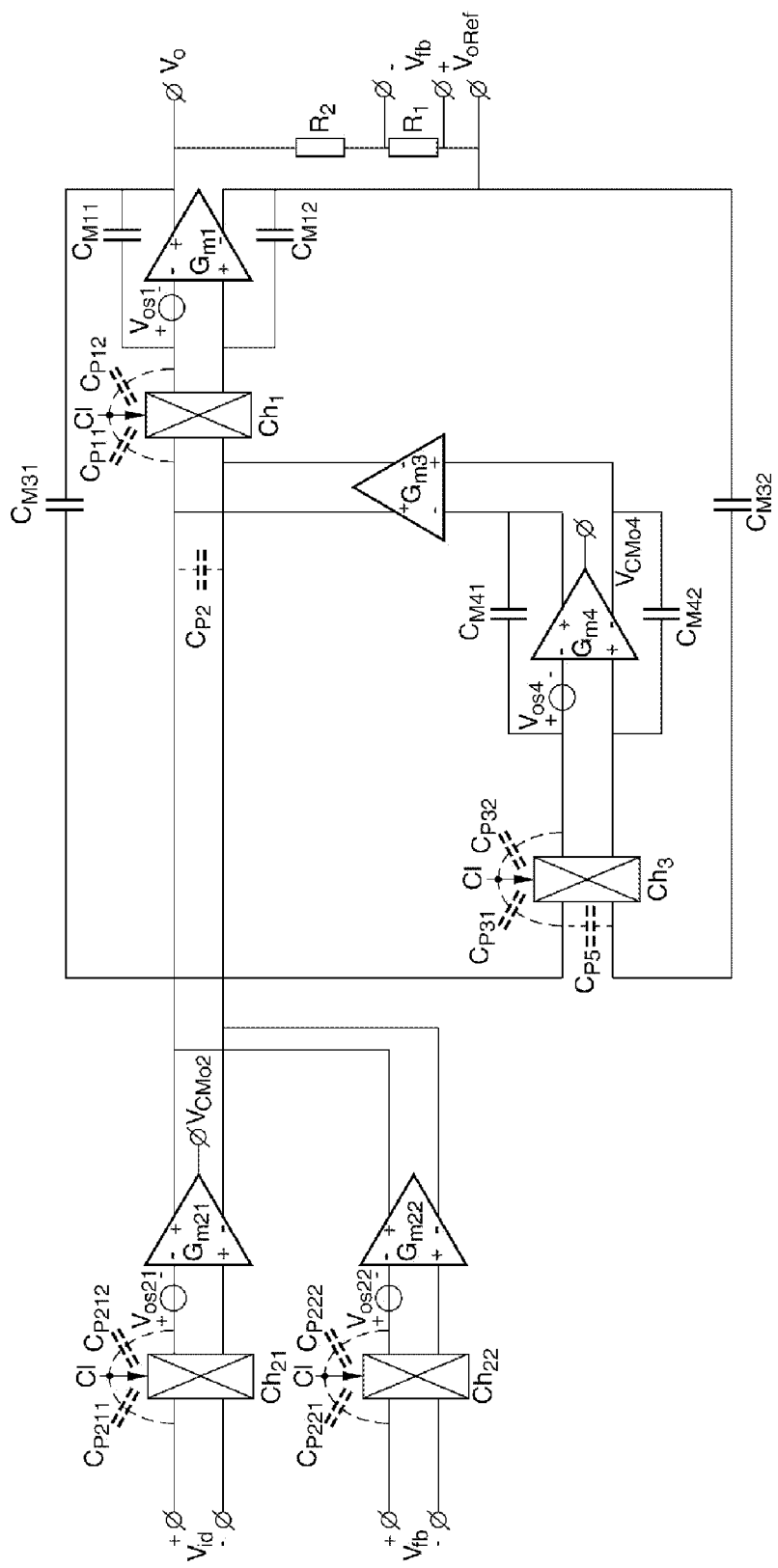
FIG. 3 is a diagram illustrating one embodiment of a current-feedback instrumentation amplifier in accordance with the present invention.
Figure 7:
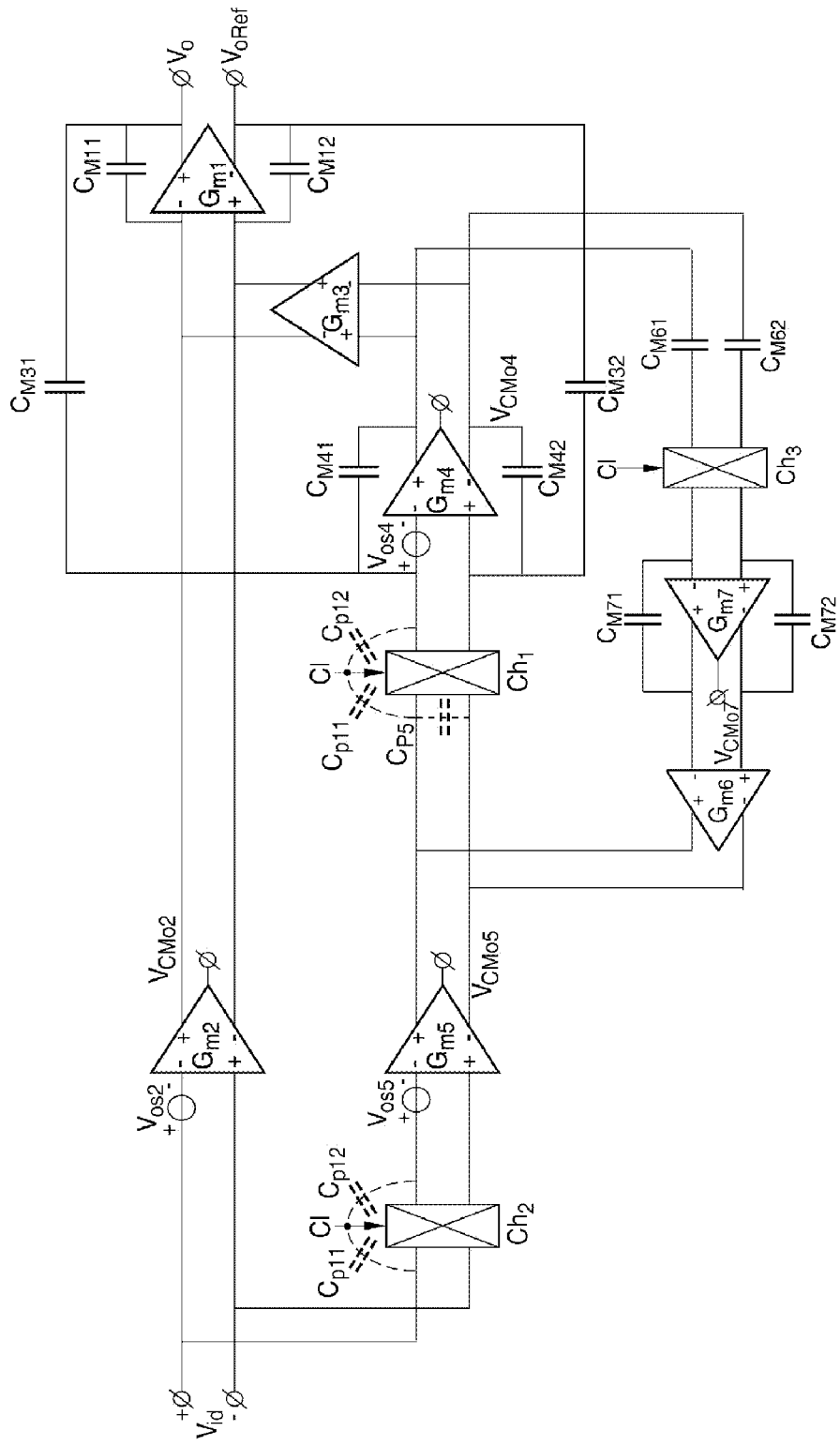
FIG. 7 is a diagram illustrating still another embodiment of an operational amplifier in accordance with the present invention.

The Current-Feedback Instrumentation Amplifier of FIG. 3 shows how we can eliminate the feed-forward amplifiers Gm51 and Gm52 of the circuit of FIG. 8.3 of the Springer paper, or FIG. 18 and FIG. 7 of the U.S. Pat. No. 7,209,000.

The ripple reduction loop functions in the same way as in the above operational amplifier of FIG. 1. If Gm21 and Gm22 have offset, then the chopper amplifier will show a ripple at the output. This ripple is sensed by Cm31 and Cm32, rectified by Ch3, and integrated by Gm4. The control amplifier finally corrects the offset of Gm21 and Gm22, so that the origin of the ripple is taken away.

Also in this case, the offset of Gm4 poses a floor for the ripple reduction. Therefore an offset reduction loop around Gm4 is applied in the circuit of FIG. 4.

Figure 4A:
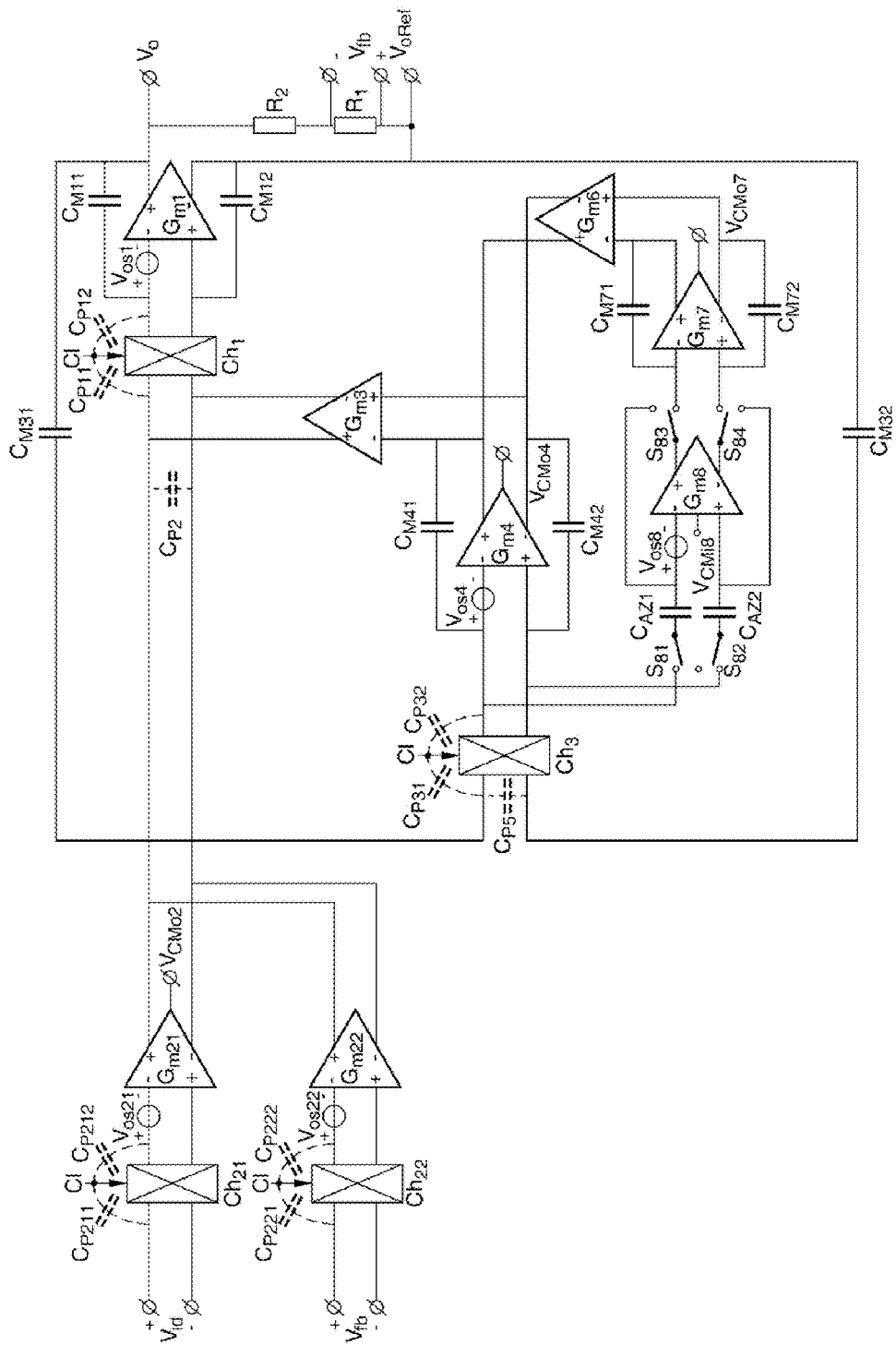
FIG. 4a is a diagram illustrating another embodiment of a current-feedback instrumentation amplifier in accordance with the present invention, this embodiment having an offset compensation loop.
Figure 4B:
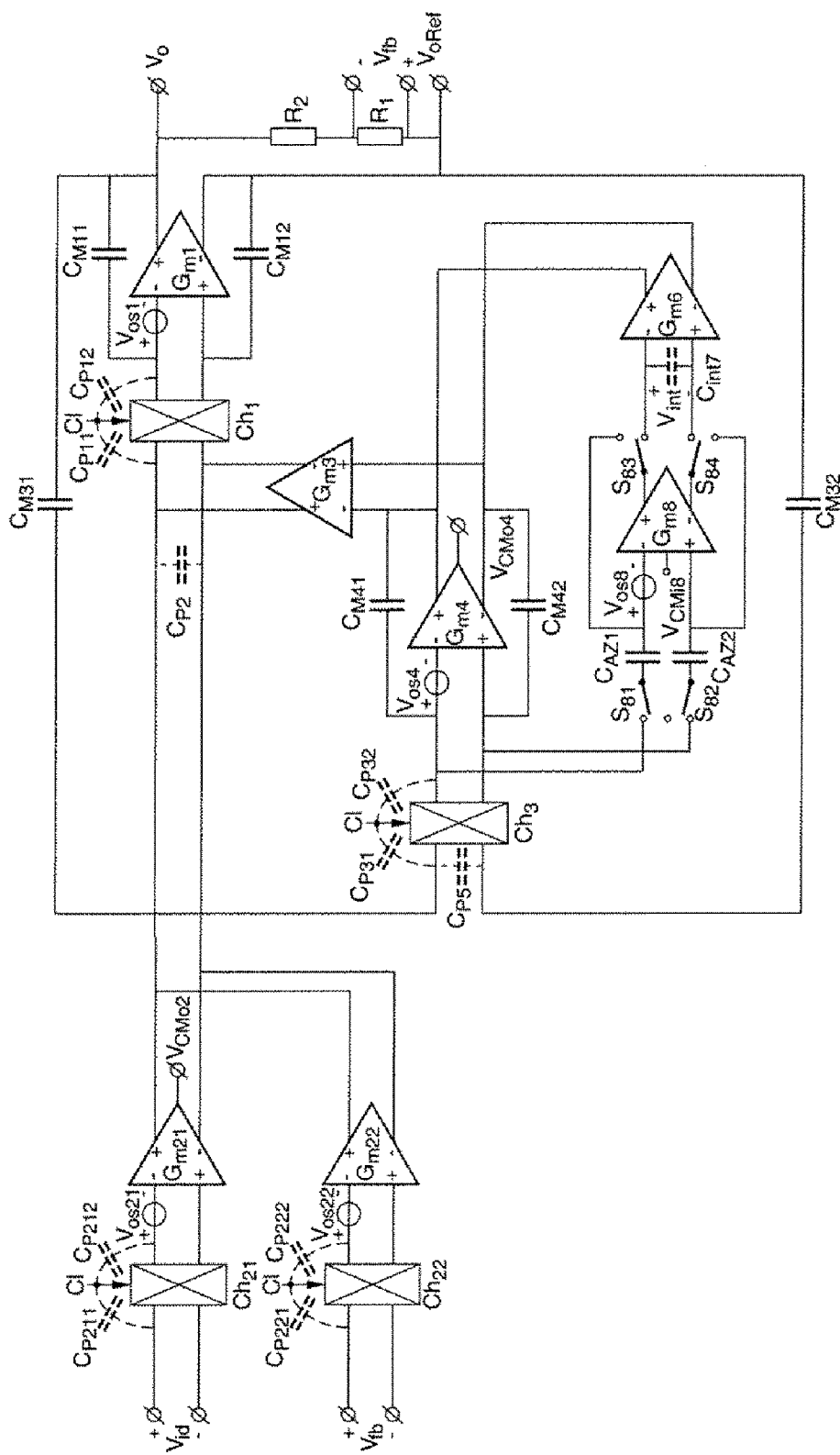
FIG. 4b is a diagram illustrating another embodiment of a current-feedback operational amplifier in accordance with the present invention, this embodiment having an alternate offset compensation loop.
Figure 4C:
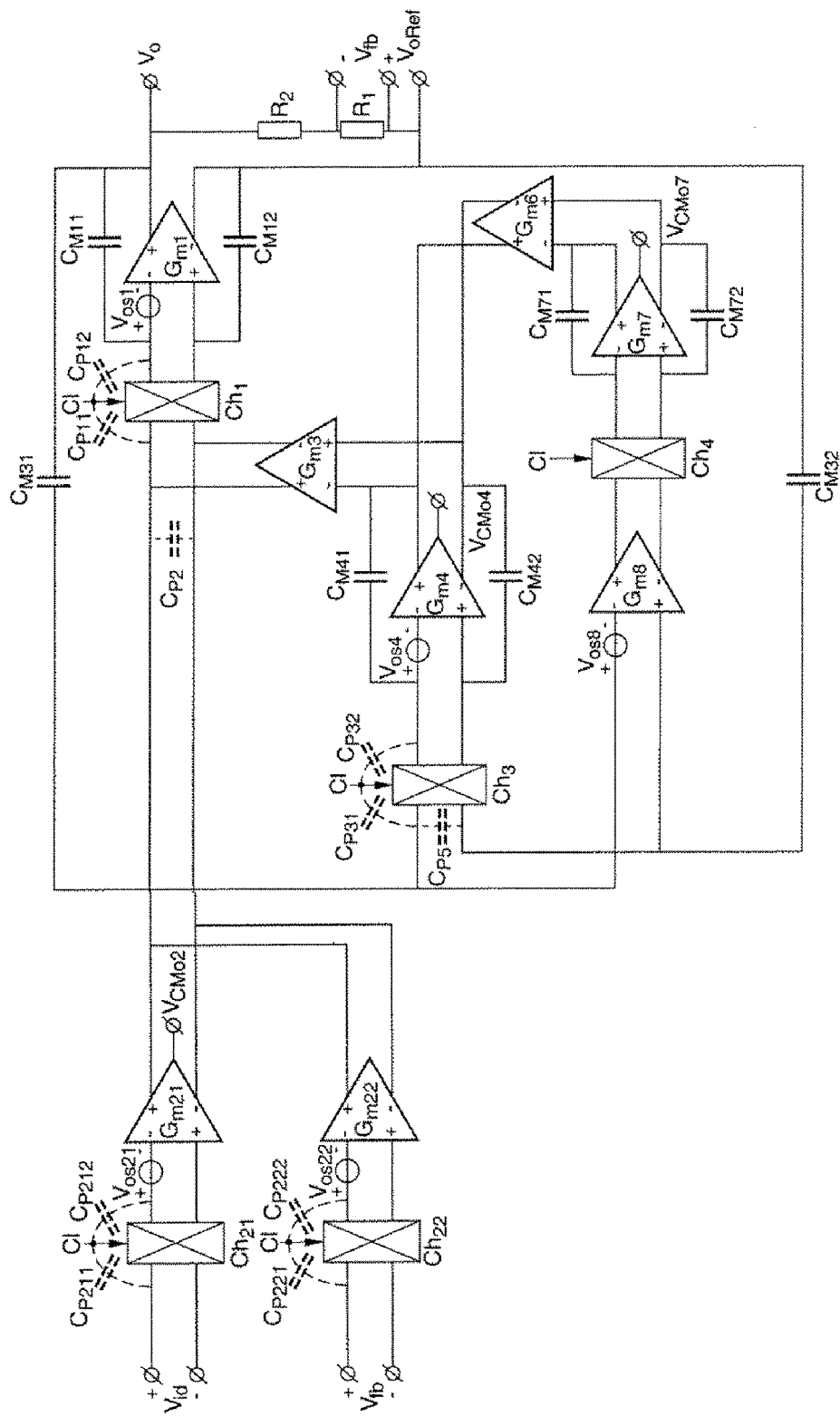
FIG. 4c is a diagram illustrating still another embodiment of a current-feedback operational amplifier in accordance with the present invention, this embodiment having a further alternate offset compensation loop.

The Current-Feedback Instrumentation Amplifier of FIGS. 4a, 4b and 4c (see FIG. 8.4 of the Springer paper) show how for example the offset of Gm4 is reduced by an offset reduction loop. They are similar to the amplifier of FIG. 3 with the offset compensation loops of FIGS. 2a, 2b and 2c, respectively, so will not further be explained here.

Besides a chopper and virtual ground of the input of Gm4, it is also possible to approach the offset in the current domain. This is shown by FIG. 5.

Figure 5:
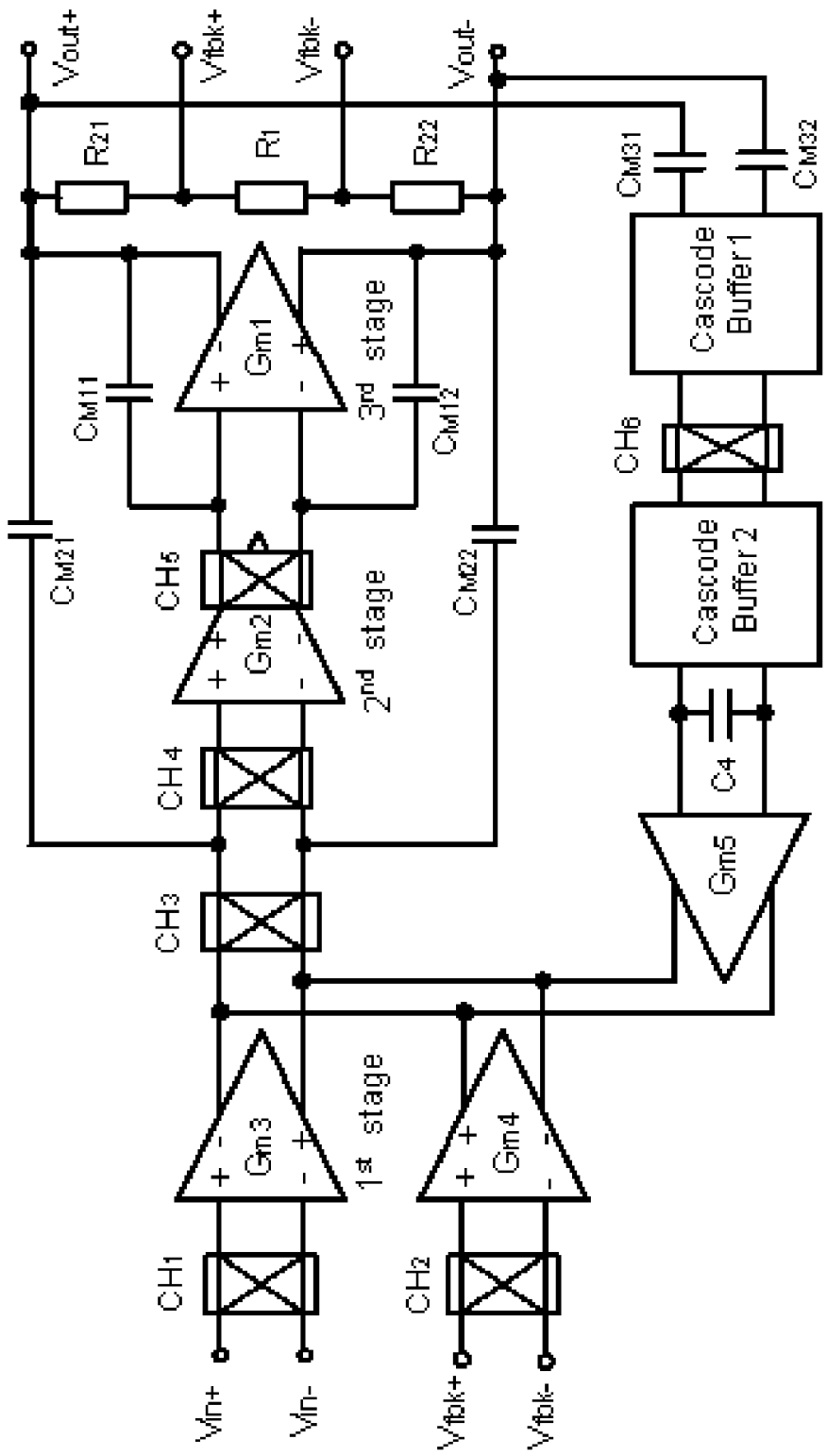
FIG. 5 is a diagram illustrating still another embodiment of an instrumentation amplifier in accordance with the present invention.

FIG. 5 shows how the offset can be reduced in the current domain. First, the currents of the ripple sense capacitors C31 and C32 are going into the low impedance input of a cascode buffer stage. After that, the signal is rectified in a chopper Ch6. Then the signal is buffered again in a second cascode buffer stage and integrated by a passive integrator C4. The offset and integrator signal on C4 now has no influence anymore on the signals of the sense capacitors C41 and C42. A small ripple can now occur because of the output offset current of cascode buffer1. If needed, this offset can be reduced by a local offset cancellation loop around cascode buffer1, for example with chopper stabilization.

Figure 6:
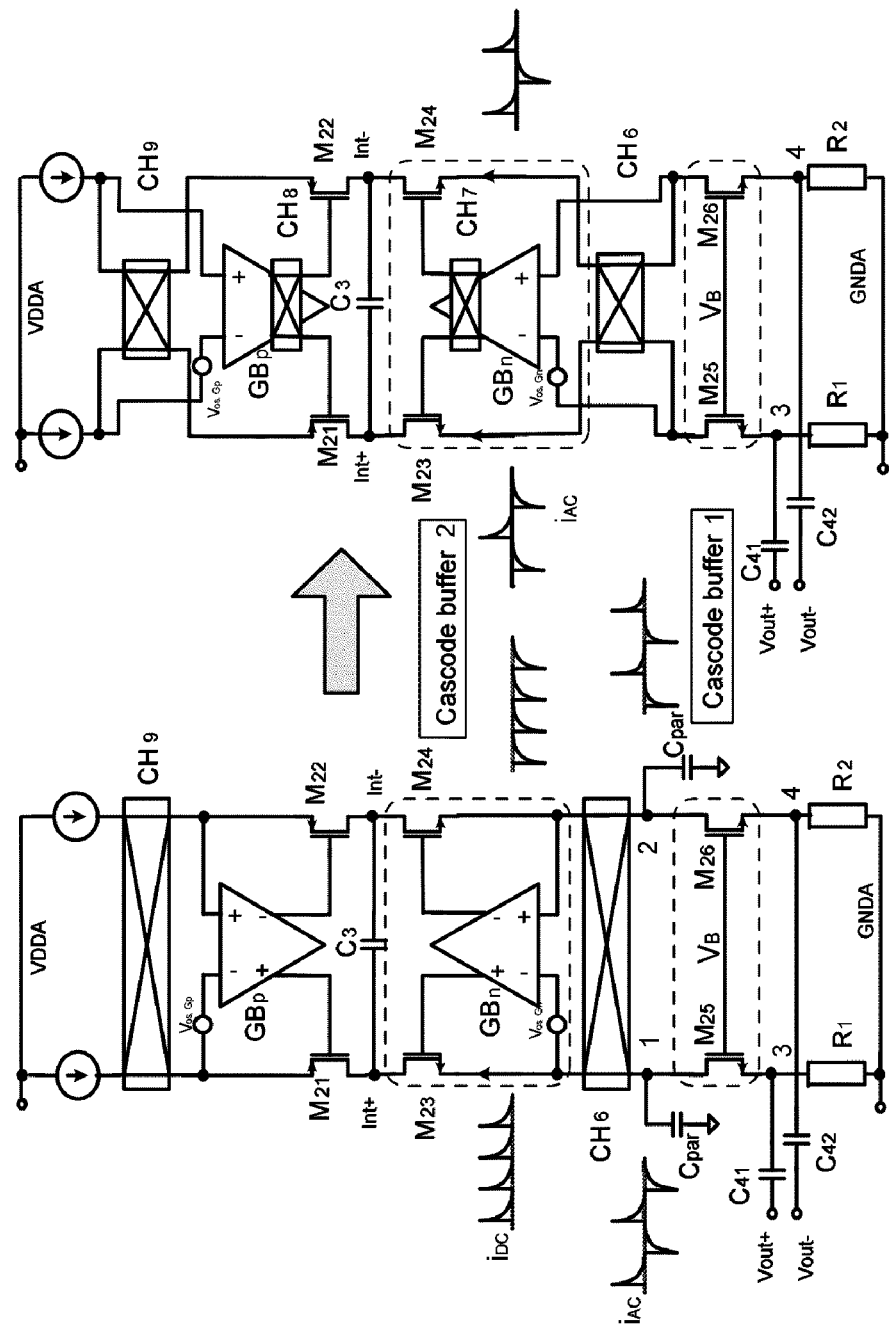
FIG. 6 is a diagram illustrating a typical cascode buffer that may be used in the embodiment of FIG. 5.

FIG. 6 shows a circuit implementation of the cascode buffer1 and cascode buffer1 used in a preferred embodiment. This circuit is described in a paper by M. Kashmiri et all (M. Kashmiri et al. "A Temperature-to-Digital Converter Based on an Optimized Electrothermal Filter," *ESSCIRC Dig. Tech. Papers*, pp. 74-77, September 2008) though in that paper the circuit was not used as a buffer.

The ripple reduction loop can also be applied to the chopper correction loops of chopper-stabilized OpAmps and InstAmps. This is shown below in FIG. 7. In FIG. 7.3 of the Springer paper, auto-zeroing of Gm5 was needed to remove the offset of the chopper correction amplifier. That offset causes a ripple. A drawback of that method is extra noise by the auto-zero function. Now with the ripple reduction loop of the present invention, that is eliminated. The ripple reduction loop consists of the ripple sensing capacitors Cm61 and Cm62. They feel the ripple from the chopper amplifier Gm5 at the output of the integrator Gm4. The ripple is rectified by Ch3 and integrated by Gm7. The control amplifier Gm6 finally corrects the offset of the chopper amplifier Gm5. Therefore the ripple is strongly reduced, while the offset of the main amplifier is taken away without adding the extra noise of the auto-zero function in the chopper correction amplifier, as was the case in the related amplifier of FIG. 7.3 of the Springer paper.

In FIG. 8 finally, the ripple reduction loop has been applied to a chopper-stabilized current-feedback instrumentation amplifier. The current-feedback Instrumentation amplifier has been explained in the Springer paper with reference to FIG. 7.7. The ripple reduction loop functions in the same way as in the case of the operational amplifier of FIG. 7.

In the foregoing description, the various preferred embodiments are generally shown as using differential amplifiers, though single ended amplifiers may also be used. Also the word amplifier as used herein and in the claims to follow is not used in a limiting sense, but in a broad sense, and can include voltage amplifiers, as well as amplifiers fabricated using not only CMOS transistors, but also other types of transistors, such as by way of example, bipolar transistors, and may include amplifiers of single or multiple stages.

Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. In an amplifier system, with a ripple reduction loop comprising:
   a first chopper;
   a first amplifier having an input coupled to an output of the first chopper;

a second chopper having an input coupled to an output of the first amplifier;

a second amplifier having an input coupled to an output of the second chopper;

a third chopper, an output of the second amplifier having its output capacitively coupled to an input of the third chopper;

a third amplifier coupled as an integrator having an input coupled to an output of the third chopper, an output of the integrator being coupled to combine with the output of the first amplifier as the input of the second chopper; and at least one Miller capacitor coupled between an output of the second amplifier and the input of the second amplifier.

2. The amplifier system of claim 1 wherein the output of the integrator is coupled through a fourth amplifier to combine with the output of the first amplifier as the input of the second chopper.

3. The amplifier system of claim 1 further comprising:
an offset compensation loop coupled to reduce the effect of the offset of the third amplifier.

4. The amplifier system of claim 3 wherein the offset compensation loop comprises an auto-zero loop coupled between the input and output of the third amplifier.

5. The amplifier system of claim 3 wherein the offset compensation loop comprises a chopper loop coupled between the input of the third chopper and the output of the third amplifier.

6. The amplifier system of claim 1 or 3 further comprising:
a fourth chopper having an input coupled to a second amplifier system input;
a fourth amplifier, the fourth amplifier having an input coupled to an output of the fourth chopper and an output coupled to combine with the output of the first amplifier.

7. The amplifier system of claim 1 wherein the input of the first chopper is a first amplifier system input, and the output of the second amplifier is an output of the amplifier system.

8. The amplifier system of claim 1 wherein the output of the integrator is coupled through a fifth amplifier to combine with the output of the first amplifier.

9. The amplifier system of claim 1 further comprising:
an offset compensation loop coupled to reduce the effect of the offset of the third amplifier.

10. The amplifier system of claim 9 wherein the offset compensation loop comprises an auto-zero loop coupled between the input and output of the third amplifier.

11. The amplifier system of claim 9 wherein the offset compensation loop comprises a chopper loop coupled between the input of the third chopper and the output of the third amplifier.

12. The amplifier system of claim 1 wherein:
the output of the second amplifier is capacitively coupled to the integrator through a first cascode buffer coupled to a third chopper; and
the integrator is a second cascode buffer having an output coupled to a capacitor.

13. The amplifier system of claim 12 wherein the second chopper is coupled to the second amplifier through a fourth chopper coupled to a fourth amplifier that is coupled to a fifth chopper.

14. The amplifier system of claim 12 further comprising:
a fourth chopper;
a fourth amplifier, the input of the first and fourth choppers forming the inputs of the amplifier system;
an output of the fourth chopper being coupled to the input of the fourth amplifier;
an output of the fourth amplifier being coupled to combine with the output of the first amplifier.

15. The amplifier system of claim 1 further comprising:
fourth and fifth amplifiers;
an input to the fourth amplifier being coupled to a first amplifier system input and to the input of the first chopper;
an output of the fourth amplifier being coupled to an input of the fifth amplifier;
an output of the fifth amplifier being coupled as an output of the amplifier system;
the output of the second amplifier also being coupled to combine with the output of the fourth amplifier.

16. The amplifier system of claim 15 wherein the output of the second amplifier is coupled to combine with the output of the fourth amplifier through a sixth amplifier.

17. The amplifier system of claim 16 wherein the output of the integrator is coupled through a seventh amplifier to combine with the output of the first amplifier as the input of the second chopper.

18. The amplifier of claim 15 further comprising:
sixth and seventh amplifiers;
a fourth chopper;
a second input of the amplifier system being coupled as an input of the sixth amplifier and being coupled as an input to the fourth chopper;
an output of the sixth amplifier being coupled to combine with the output of the fourth amplifier;
an output of the fourth chopper being coupled as an input to the seventh amplifier;
an output of the seventh amplifier being coupled to combine with the output of the first amplifier.

19. The amplifier of claim 18 further comprising:
eighth and ninth amplifiers;
the output of the second amplifier being coupled through the eighth amplifier to combine with the output of the fourth amplifier; and
the output of the integrator being coupled through the ninth amplifier to combine with the output of the first amplifier as the input of the second chopper.

20. The amplifier system of claim 3 wherein the input of the first chopper is a first amplifier system input, and the output of the second amplifier is an output of the amplifier system.

21. The amplifier system of claim 3 wherein the output of the integrator is coupled through a fifth amplifier to combine with the output of the first amplifier.

* * * * *